(12) United States Patent
Owaki et al.

(10) Patent No.: US 8,692,439 B2
(45) Date of Patent: Apr. 8, 2014

(54) SURFACE ACOUSTIC WAVE RESONATOR, SURFACE ACOUSTIC WAVE OSCILLATOR, AND ELECTRONIC DEVICE

(75) Inventors: Takuya Owaki, Minowa (JP); Kunihito Yamanaka, Minowa (JP)

(73) Assignee: Seiko Epson Corporation (JP)

( * ) Notice: Subject to any disclaimer, the term of this patent is extended or adjusted under 35 U.S.C. 154(b) by 269 days.

(21) Appl. No.: 13/212,801

(22) Filed: Aug. 18, 2011

(65) Prior Publication Data

US 2012/0049969 A1    Mar. 1, 2012

(30) Foreign Application Priority Data

Aug. 26, 2010  (JP) ................. 2010-189864

(51) Int. Cl.
  *H03H 9/145*  (2006.01)
  *H03H 9/25*  (2006.01)
  *H03H 9/19*  (2006.01)
  *H03H 9/00*  (2006.01)

(52) U.S. Cl.
  USPC ............... 310/313 A; 310/313 B; 310/313 D; 310/360; 333/194; 333/195

(58) Field of Classification Search
  USPC ............. 310/313 R, 313 A–313 D, 360; 333/193–196
  See application file for complete search history.

(56) References Cited

U.S. PATENT DOCUMENTS

| | | | |
|---|---|---|---|
| 382,217 A | 5/1888 | Davies | |
| 4,387,355 A | 6/1983 | Uno et al. | |
| 5,179,310 A | 1/1993 | Satoh et al. | |
| 6,154,105 A | 11/2000 | Fujimoto et al. | |
| 6,329,888 B1 | 12/2001 | Hirota | |
| 6,414,414 B1 | 7/2002 | Wright | |
| 6,774,747 B2 | 8/2004 | Yamazaki et al. | |
| 6,784,595 B2 | 8/2004 | Iizawa et al. | |
| 6,856,218 B2 | 2/2005 | Yamazaki et al. | |
| 6,946,930 B2 | 9/2005 | Kadota et al. | |
| 7,135,805 B2 | 11/2006 | Yamanouchi | |
| 7,315,805 B2 | 1/2008 | Slater | |

(Continued)

FOREIGN PATENT DOCUMENTS

| | | |
|---|---|---|
| JP | 54-156455 | 12/1979 |
| JP | 57-005418 | 1/1982 |

(Continued)

OTHER PUBLICATIONS

Yasutaka Shimizu (Tokyo Institute of Technology) and Yasushi Yamamoto (Nippon Electric Co., Ltd.), "A new Cut of quartz for SAW with more stable temperature characteristics" Mar. 26, 1982 (13 pages).

(Continued)

*Primary Examiner* — Thomas Dougherty
(74) *Attorney, Agent, or Firm* — Harness, Dickey & Pierce, P.L.C.

(57) ABSTRACT

A surface acoustic wave resonator has a quartz crystal substrate having Euler angles of ($\phi=0°$, $110°\leq\theta\leq150°$, $88°\leq\psi\leq92°$) and an IDT having a plurality of electrode fingers disposed on the quartz crystal substrate, and using a surface acoustic wave as an excitation wave, a plurality of grooves arranged in a propagation direction of the surface acoustic wave to form stripes is disposed on the quartz crystal substrate, and the electrode fingers are disposed one of between the grooves and inside the grooves.

9 Claims, 4 Drawing Sheets

(56) References Cited

U.S. PATENT DOCUMENTS

| | | |
|---|---|---|
| 7,352,104 B2 | 4/2008 | Yamazaki et al. |
| 7,382,217 B2 | 6/2008 | Morita et al. |
| 7,589,451 B2 | 9/2009 | Morita et al. |
| 7,696,675 B2 | 4/2010 | Kanna |
| 8,063,534 B2 | 11/2011 | Iizawa |
| 8,084,918 B2 | 12/2011 | Iizawa |
| 8,305,162 B2 | 11/2012 | Yamanaka |
| 2002/0171512 A1 | 11/2002 | Kadota et al. |
| 2003/0030513 A1 | 2/2003 | Yamazaki et al. |
| 2003/0052572 A1 | 3/2003 | Iizawa et al. |
| 2003/0146810 A1 | 8/2003 | Yamazaki et al. |
| 2004/0135469 A1 | 7/2004 | Kanna |
| 2004/0201306 A1 | 10/2004 | Yamanouchi |
| 2005/0127781 A1 | 6/2005 | Yamazaki et al. |
| 2006/0108894 A1 | 5/2006 | Kanna |
| 2006/0145568 A1 | 7/2006 | Morita et al. |
| 2007/0182278 A1 | 8/2007 | Kanna |
| 2008/0084134 A1 | 4/2008 | Morita et al. |
| 2009/0026955 A1 | 1/2009 | Otterstatter et al. |
| 2009/0206955 A1 | 8/2009 | Iizawa |
| 2010/0001617 A9 | 1/2010 | Kanna |
| 2010/0219913 A1 | 9/2010 | Yamanaka |
| 2010/0244626 A1 | 9/2010 | Yamanaka |
| 2011/0199163 A1 | 8/2011 | Yamanaka |
| 2011/0309897 A1 | 12/2011 | Yamanaka |
| 2012/0049969 A1 | 3/2012 | Owaki et al. |
| 2012/0049979 A1 | 3/2012 | Owaki et al. |
| 2012/0062069 A1 | 3/2012 | Yamanaka |
| 2012/0062070 A1* | 3/2012 | Yamanaka et al. ......... 310/313 A |
| 2012/0062329 A1* | 3/2012 | Yamanaka ................. 331/158 |
| 2012/0068573 A1* | 3/2012 | Obata ....................... 310/313 A |
| 2012/0086308 A1* | 4/2012 | Obata et al. ............... 310/313 A |
| 2013/0027147 A1 | 1/2013 | Yamanaka |

FOREIGN PATENT DOCUMENTS

| | | |
|---|---|---|
| JP | 575418 | 1/1982 |
| JP | 57-099813 | 6/1982 |
| JP | 58-033309 | 2/1983 |
| JP | 61-092011 | 5/1986 |
| JP | 01034411 A | 2/1989 |
| JP | 134411 | 7/1989 |
| JP | 01-231412 | 9/1989 |
| JP | 02-189011 | 7/1990 |
| JP | 03-284009 | 12/1991 |
| JP | 05-007124 | 1/1993 |
| JP | 05-090865 | 4/1993 |
| JP | 590865 | 4/1993 |
| JP | 10-270974 | 10/1998 |
| JP | 11-214958 | 8/1999 |
| JP | 11-298290 | 10/1999 |
| JP | 2000-188521 | 7/2000 |
| JP | 2000-216632 A | 8/2000 |
| JP | 2002-100959 | 4/2002 |
| JP | 2002-517933 | 6/2002 |
| JP | 2002-330051 | 11/2002 |
| JP | 2003-124780 | 4/2003 |
| JP | 2003-152487 | 5/2003 |
| JP | 2003-258601 | 9/2003 |
| JP | 2005-012736 | 1/2005 |
| JP | 2005-204275 | 7/2005 |
| JP | 2006-074136 | 3/2006 |
| JP | 2006-148622 | 6/2006 |
| JP | 2006-186623 | 7/2006 |
| JP | 2006-203408 | 8/2006 |
| JP | 2006-295311 | 10/2006 |
| JP | 2006-339742 | 12/2006 |
| JP | 2007-028664 | 2/2007 |
| JP | 2007093213 A | 4/2007 |
| JP | 2007-142794 | 6/2007 |
| JP | 2007-208871 | 8/2007 |
| JP | 2007-259414 | 10/2007 |
| JP | 2007-267033 | 10/2007 |
| JP | 2007-281701 | 10/2007 |
| JP | 2007-300174 | 11/2007 |
| JP | 2007-300287 | 11/2007 |
| JP | 2007333500 A | 12/2007 |
| JP | 2008-078984 | 4/2008 |
| JP | 2008-236295 | 10/2008 |
| JP | 2008286520 A | 11/2008 |
| JP | 2008286521 A | 11/2008 |
| JP | 2009-225420 | 10/2009 |
| JP | 2010-233203 | 10/2010 |
| JP | 2010-233203 A | 10/2010 |
| WO | 2005099089 A1 | 10/2005 |
| WO | 2010/098139 | 2/2010 |
| WO | WO-2010-047114 A1 | 4/2010 |

OTHER PUBLICATIONS

Takehiko Uno, Nobuhide Miyamoto and Hiroshi Abe (Electrical Communication Laboratories, NTT), "Fabrication of SAW Resonators with Groove Gratings and their Characteristics", (date-unknown) (pp. 45-52) with English translation.

Takehiko Uno, Nobuhide Miyamoto and Hiroshi Abe (Electrical Communication Laboratories, NTT), "Fabrication of SAW Resonators with Groove Gratings and their Characteristics", (Oct. 18, 1982) (pp. 45-52) with English translation.

Extended European Search Report for Application No. EP 10 74 6022 mailed Mar. 15, 2013 (6 pages).

Extended European Search Report for Application No. EP 10 15 4829 mailed Mar. 15, 2013 (6 pages).

Shigeo Kanna, Yooko-Kong Yong (The Institute of Electronics, Information and Communication Engineers), "Frequency-Temperature Analysis of Surface Acoustic Waves Using Finite Element Method", (Jun. 1999) (pp. 37-42) with English Translation.

* cited by examiner

SURFACE ACOUSTIC WAVE RESONATOR, SURFACE ACOUSTIC WAVE OSCILLATOR, AND ELECTRONIC DEVICE

The entire disclosure of Japanese Patent Application No. 2010-189864, filed Aug. 26, 2010 is expressly incorporated by reference herein.

BACKGROUND

1. Technical Field

The present invention relates to a surface acoustic wave resonator, and a surface acoustic wave oscillator and an electronic device using the surface acoustic wave resonator.

2. Related Art

In the past, surface acoustic wave (SAW) filters have been widely used as band-pass filters of mobile communication devices. As such conventional surface acoustic wave filters, there can be cited surface-wave resonator filters, transversal filters, and so on.

For example, as one of the conventional surface-wave resonator filters, there is a filter using an ST-cut 0° X propagation quartz crystal substrate with preferable temperature characteristics, and having an interdigital transducer (IDT), a reflector, and so on formed on the quartz crystal substrate using an electrode material made of Al so as to use the Rayleigh wave caused by the excitation of the IDT.

Further, as another of the surface-wave resonator filters, there is a filter using an ST-cut 90° X propagation quartz crystal substrate, and having an IDT, a reflector, and so on formed on the quartz crystal substrate using an electrode material made of Ta, W, Au, and so on so as to use the SH wave caused by the excitation of the IDT.

However, in the former surface-wave resonator filter having the electrode made of Al formed on the ST-cut 0° X propagation quartz crystal substrate, since the Rayleigh wave is used, there arises the following problems.

1. Since the reflectivity coefficient is small, and a number of reflector fingers are required in the device using the reflector such as a surface-wave resonator filter, downsizing is hindered.

2. Since the electromechanical coupling coefficient is small, the loss is significant.

On the other hand, the latter surface-wave resonator filter having the electrode formed on the ST-cut 90° X propagation quartz crystal substrate using the metal having a large mass load such as Ta, W, or Au has features that the electromechanical coupling coefficient is large since the SH wave is used, and that downsizing of the device can be achieved since the reflectivity coefficient is also large.

However, if the electrode is formed using the metal having a large mass load such as Ta, W, or Au, there arises a problem that the variation in the central frequency due to the variation in the width and thickness of the electrode becomes large to thereby raise the defective fraction. In other words, the larger the mass load of the material used for forming the electrode becomes, the steeper the variation in the acoustic velocity with respect to the film thickness becomes compared to Al with a small mass load, and there arises a problem that the variation in the central frequency becomes larger even with the same level of variation in the width and the thickness of the electrode as in the case of using Al with a small mass load.

In order for solving such problems, in JP-A-2002-330051 there is a description that the normalized film thickness (H/λ) of the fingers of the IDT formed of a metal film made of Al on the quartz crystal substrate for generating the SH wave is optimized, thereby obtaining a surface acoustic wave filter having a large electromechanical coupling coefficient with a small loss, and capable of reducing the influence of the film thickness of the electrode exerted on the frequency.

However, even in the document mentioned above, there is a problem that if the film thickness becomes large, a variation occurs in the film thickness to cause a variation in frequency, and thus degrading the yield to thereby raise the cost. Further, there is also a problem that the frequency fluctuation due to the heat strain with respect to the quartz crystal substrate and the temporal change becomes marked. Still further, the improvement in the electromechanical coupling coefficient has limitations.

SUMMARY

An advantage of some aspects of the invention is to reduce the variation in frequency characteristics and the frequency fluctuation due to the heat strain with respect to the quartz crystal substrate and the temporal change, and to improve the electromechanical coupling coefficient, and thus providing a highly reliable surface acoustic wave resonator, and a surface acoustic wave oscillator and an electronic device using the surface acoustic wave resonator.

Application Example 1

This application example of the invention is directed to a surface acoustic wave resonator including a quartz crystal substrate having Euler angles of ($\phi=0°$, $110°\leq\theta\leq150°$, $88°\leq\psi\leq92°$) and an IDT having a plurality of electrode fingers disposed on the quartz crystal substrate, and using a surface acoustic wave as an excitation wave, wherein a plurality of grooves arranged in a propagation direction of the surface acoustic wave to form stripes is disposed on the quartz crystal substrate, and the electrode fingers are disposed one of between the grooves and inside the grooves.

According to the configuration described above, since the IDT is formed to have a small thickness, it is possible to reduce the heat strain and the temporal change in the frequency with respect to the quartz crystal substrate, and at the same time, to reduce the variation in the thickness of the IDT, thereby reducing the cost. Further, since the large step can be formed on the quartz crystal substrate irrespective of the thickness of the IDT, the electromechanical coupling coefficient can be raised to thereby obtain the surface acoustic wave resonator with a low loss.

Application Example 2

This application example of the invention is directed to the surface acoustic wave resonator of the above application example of the invention, wherein, assuming that a wavelength of the surface acoustic wave is λ, and a step formed by the groove and the electrode finger is D, the step D fulfills the following formula.

$$0.04\lambda \leq D \leq 0.14\lambda$$

Since the electromechanical coupling coefficient can be made particularly high by setting the step in the range described above, the low-loss surface acoustic wave resonator can be obtained.

Application Example 3

This application example of the invention is directed to the surface acoustic wave resonator of the above application example of the invention, wherein, assuming that a film thickness of the electrode fingers is H, the film thickness H fulfills the following formula.

$$0.01\lambda \leq H \leq 0.06\lambda$$

By setting the film thickness of the electrode fingers in the range described above, the temporal variation in the frequency of the surface acoustic wave resonator can be prevented.

Application Example 4

This application example of the invention is directed to a surface acoustic wave oscillator including the surface acoustic wave resonator according to any of the above application examples of the invention.

According to the configuration described above, the low-loss and low-cost surface acoustic wave oscillator can be obtained.

Application Example 5

This application example of the invention is directed to an electronic device including the surface acoustic wave resonator according to any of the above application examples of the invention.

According to the configuration described above, the low-loss and low-cost electronic device can be obtained.

BRIEF DESCRIPTION OF THE DRAWINGS

The invention will be described with reference to the accompanying drawings, wherein like numbers reference like elements.

FIGS. 1A through 1C are diagrams showing a surface acoustic wave (SAW) resonator according to a first embodiment, wherein FIG. 1A is a plan view of the SAW resonator, FIG. 1B is a partial enlarged cross-sectional view of the SAW resonator, and FIG. 1C is a partial enlarged view of FIG. 1B.

FIGS. 2A and 2B are diagrams showing a surface acoustic wave (SAW) oscillator according to the present embodiment, wherein FIG. 2A is a plan view, and FIG. 2B is a cross-sectional view along the line A-A of FIG. 2A.

FIGS. 5A through 5C are diagrams showing a surface acoustic wave (SAW) resonator according to a second embodiment, wherein FIG. 5A is a plan view, FIG. 5B is a partial enlarged cross-sectional view of FIG. 5A, and FIG. 5C is a partial enlarged view of FIG. 5B.

DESCRIPTION OF EXEMPLARY EMBODIMENTS

Hereinafter, embodiments of the invention shown in the accompanying drawings will be explained in detail. It should be noted that constituents, types, combinations, shapes, relative arrangements thereof, and so on described in the present embodiments are not intended to limit the scope of the invention only thereto and are nothing more than mere explanatory examples unless specifically described.

Figure 1A:
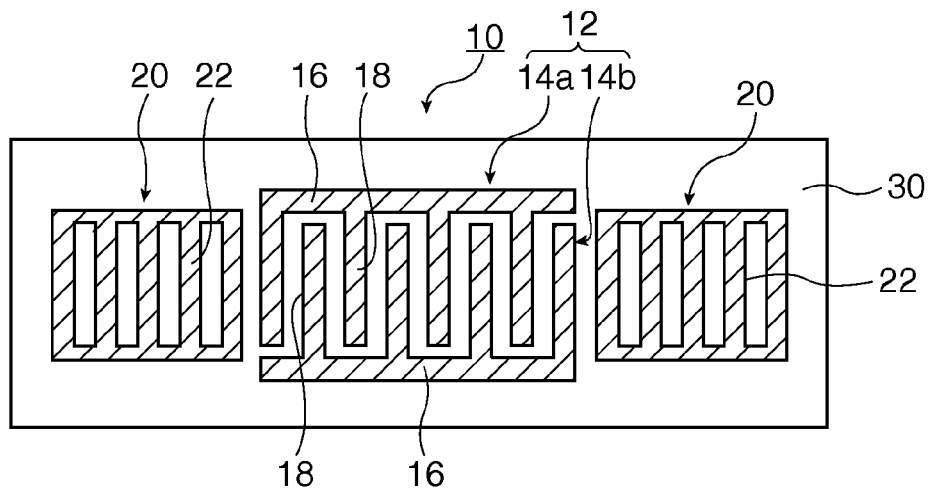
Figure 1B:
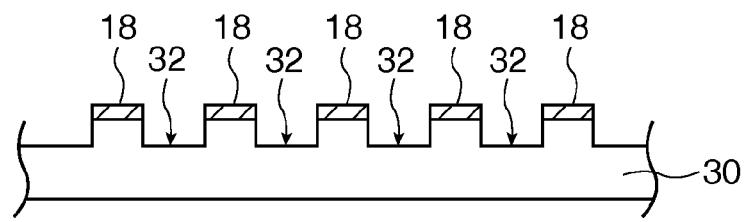
Figure 1C:
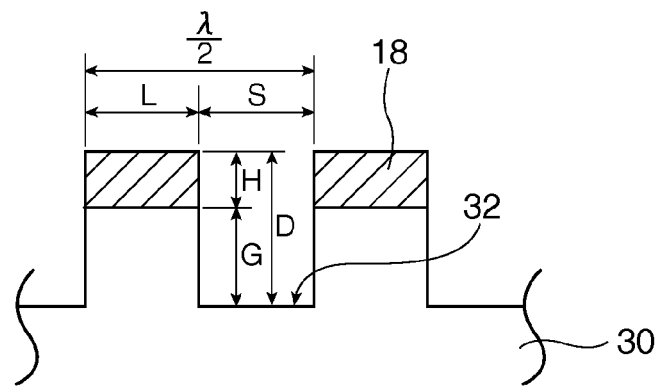

FIGS. 1A through 1C show a surface acoustic wave (SAW) resonator according to a first embodiment. Here, FIG. 1A is a plan view of the SAW resonator, FIG. 1B is a partial enlarged cross-sectional view of the SAW resonator, and FIG. 1C is a partial enlarged view of FIG. 1B.

The SAW resonator 10 according to the first embodiment is basically composed of a quartz crystal substrate 30, an IDT 12, and reflectors 20. In the present embodiment, an ST-cut 90° X propagation quartz crystal substrate with Euler angles of ($\phi=0°$, $110°\leq\theta\leq150°$, $88°\leq\psi\leq92°$) is used as the quartz crystal substrate 30. Further, in the present embodiment, the IDT 12 for exciting the SH wave, which is a surface acoustic wave, as an excitation wave is disposed on the quartz crystal substrate 30, and the two reflectors 20 for reflecting the SH wave are disposed on both ends of the IDT 12. It should be noted that in the Euler angles of the quartz crystal substrate 30 of the present embodiment, the angle $\phi$ includes a tolerance in a range of $-1°\leq\phi\leq1°$.

The IDT 12 has a pair of comb-shaped electrodes 14a, 14b each having a plurality of electrode fingers 18 connected to each other at the base end with a bus bar 16, and has the electrode fingers 18 constituting one comb-shaped electrode 14a (or 14b) and the electrode fingers 18 constituting the other comb-shaped electrode 14b (or 14a) disposed alternately with predetermined intervals. Here, the electrode fingers 18 have the longitudinal direction perpendicular to the X axis, and are arranged in the X-axis direction to form stripes. Further, the IDT 12 excites the SH wave in a direction rotated in-plane 90° from the X axis due to an alternating-current voltage applied thereto.

The pair of reflectors 20 are disposed so as to hold the IDT 12 on the both sides in the propagation direction of the SH wave excited by the IDT 12. As a specific configuration, two or more conductor strips 22 disposed in parallel to the electrode fingers 18 constituting the IDT 12 are connected to each other at both ends.

It should be noted that the reflectors are not necessarily required in a edge reflection SAW resonator positively using the reflected wave from an edge of the quartz crystal substrate in the SAW propagation direction, and in a multi-pair IDT SAW resonator having an increased number of pairs of electrode fingers of the IDT to thereby excite the standing wave of the SAW by the IDT itself.

As the material of the electrode film constituting the IDT 12 and the reflectors 20 configured as described above, aluminum (Al) or an alloy including Al as a main constituent can be used. It should be noted that in the case of using the alloy as the electrode film material, it is sufficient to limit the metal other than Al, the principal component, to not greater than 10% by weight.

The quartz crystal substrate 30 in the SAW resonator 10 having the basic configuration described above is provided with grooves 32 (inter-electrode finger grooves) disposed between the electrode fingers 18 of the IDT 12 and between the conductor strips 22 of the reflectors 20.

Here, based on the depth (G) of the grooves 32 provided to the quartz crystal substrate 30 and the thickness (H) of the electrode films (18, 22), the step (D=G+H) to be formed on the substrate is defined as a sum thereof, and the dimension of the step is in a range of the formula 1 described later based on the wavelength $\lambda$ of the SH wave to be generated in the SAW resonator 10. It should be noted that the line occupation ratio $\eta$ ($\eta=S/(L+S)$), the ratio between the width L of the electrode fingers 18 and the width S of the grooves 32, is appropriately designed taking the frequency characteristics and so on into consideration.

Figure 2A:
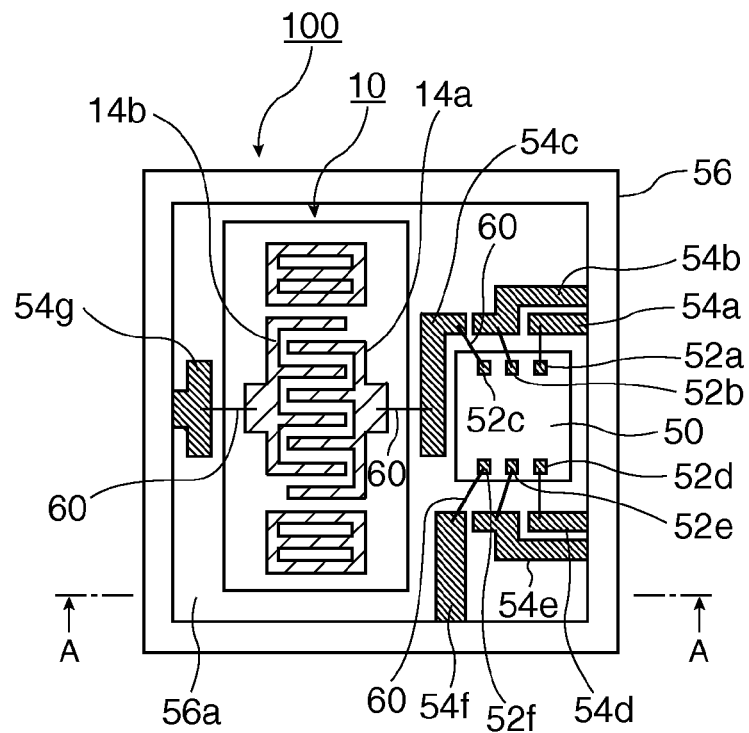
Figure 2B:
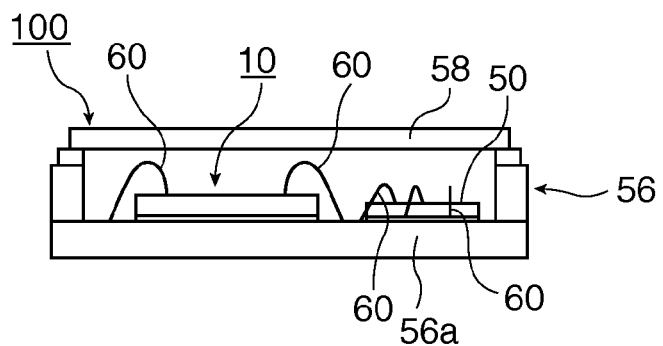

FIGS. 2A and 2B show a surface acoustic wave (SAW) oscillator according to present embodiment. FIG. 2A is a plan view, and FIG. 2B is a cross-sectional view of FIG. 2A along the line A-A. As shown in FIGS. 2A and 2B, the SAW oscillator 100 according to the present embodiment is mainly composed of the SAW resonator 10 described above, an integrated circuit (IC) 50 for performing drive control by applying a voltage to the IDT 12 of the SAW resonator 10, and a package 56 for housing these components. It should be noted that in FIGS. 2A and 2B, FIG. 2A is a plan view with a lid removed, and FIG. 2B is a diagram showing the A-A cross-section in FIG. 2A.

In the SAW oscillator 100 according to the present embodiment, the SAW resonator 10 and the IC 50 are housed in the same package 56, and electrode patterns 54a through 54g provided to a bottom plate 56a of the package 56 are connected respectively to the comb-shaped electrodes 14a, 14b of the SAW resonator 10 and pads 52a through 52f of the IC 50 with metal wires 60. Further, a cavity of the package 56 housing the SAW resonator 10 and the IC 50 is sealed airtightly with the lid 58. By adopting the configuration described above, the IDT 12 (see FIG. 1A) and the IC 50 can be connected electrically to external mounting electrodes provided to the bottom surface of the package 56.

Further, the SAW resonator 10 according to the present embodiment can be mounted on an electronic device such as a cellular phone, a hard disk drive, a server, a computer, a wired/wire-less base station, or an in-vehicle communication device.

The inventors have conducted the investigation of the temporal change in the electromechanical coupling coefficient and the frequency when varying the dimension of the step provided to the SAW resonator. In the present investigation, an ST-cut 90° X propagation quartz crystal substrate with Euler angles of ($\phi=0°$, $\theta=123°$, $\psi=90°$) has been used as the quartz crystal substrate. Further, the investigation has been conducted using a SAW resonator (type 1) having the IDT formed without forming the grooves on the quartz crystal substrate and having the dimension of the step varied by varying the film thickness, a SAW resonator (type 2) with the film thickness (H) of the IDT fixed to $0.01\lambda$, and having the grooves provided to the quartz crystal substrate, and having the dimension of the step varied by varying the depth of the grooves, and a SAW resonator (type 3) with the film thickness (H) of the IDT fixed to $0.02\lambda$, and having the grooves provided to the quartz crystal substrate, and having the dimension of the step varied by varying the depth of the grooves. It should be noted that in either of the types the width of the electrode fingers of the IDT and the width of the grooves have been designed to be equal to each other (i.e., the line occupation ratio $\eta=0.5$). Further, in the type 2 and the type 3, the sum of the film thickness (H) of the IDT and the depth (G) of the grooves corresponds to the dimension of the step (D=H+G).

Figure 3:
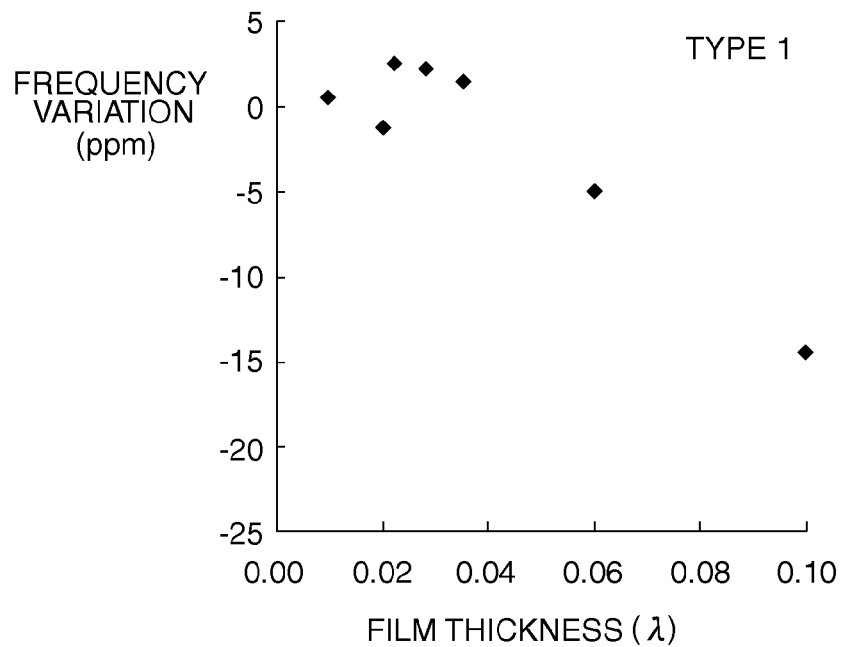
FIG. 3 is a diagram showing the temporal variation in frequency by an aging test.

FIG. 3 is a diagram showing the temporal variation in frequency by an aging test. In the aging test, the frequency variation in the case of leaving the SAW resonator of the type 1 in the 125° C. atmosphere for 3000 hours has been measured. Then, it has turned up that the temporal variation in the frequency increases if the film thickness (H) of the IDT is increased in the type 1. It has been turned up that the temporal variation in the frequency increases rapidly if the film thickness is set in particular to $0.06\lambda$ or larger.

Figure 4:
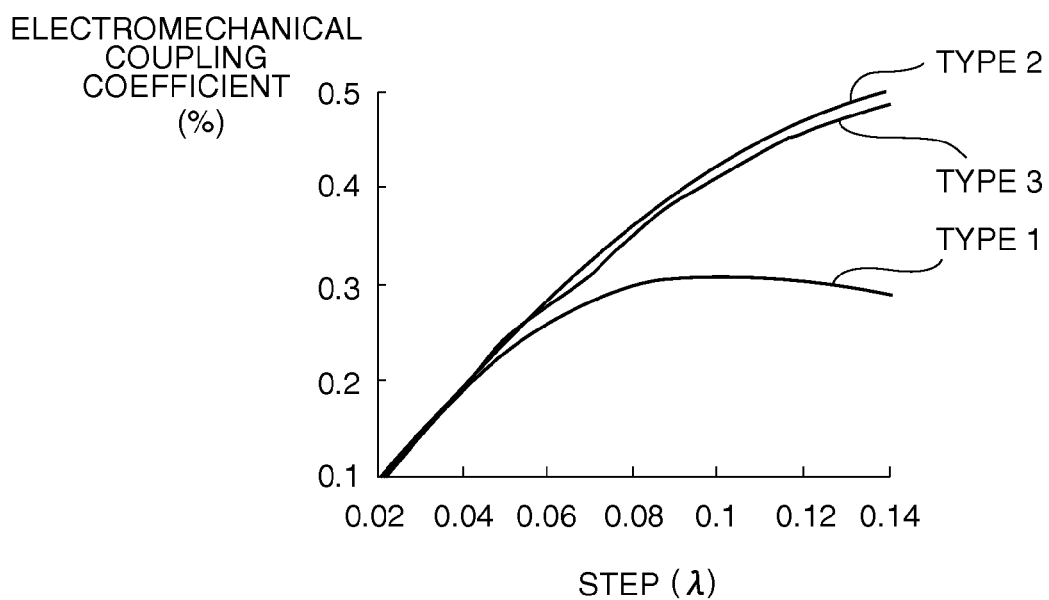
FIG. 4 is a diagram showing the variation in the electro-mechanical coupling coefficient in the case of varying a step provided to the SAW resonator.

FIG. 4 is a diagram showing the variation in the electromechanical coupling coefficient in the case of varying the step provided to the SAW resonator. It is understood that in the type 1, if the film thickness (H) of the IDT formed on the quartz crystal substrate is increased, the value of the electromechanical coupling coefficient rises, and becomes the maximum at the point in which the step is approximately equal to $0.1\lambda$. As is understood from FIGS. 3 and 4, in the type 1, it is not achievable to simultaneously perform both of the optimization of the electromechanical coupling coefficient by the adjustment of the film thickness and the optimization for minimizing the temporal variation in the frequency by the adjustment of the film thickness.

On the other hand, as shown in FIG. 4, in the SAW resonators of the type 2 and the type 3, the electromechanical coupling coefficient increases monotonically as the step (G) is increased, and shows roughly the same value as that of the type 1.

Then, when the step (D) reaches $0.04\lambda$, the type 1 has the film thickness (H) of the IDT of $0.04\lambda$, and the electromechanical coupling coefficient of 0.191%. On the other hand, the type 2 has the film thickness (H) of $0.01\lambda$ (fixed), the depth (G) of the grooves of $0.03\lambda$, and the electromechanical coupling coefficient of 0.195%. Further, the type 3 has the film thickness (H) of $0.02\lambda$ (fixed), the depth (G) of the grooves of $0.02\lambda$, and the electromechanical coupling coefficient of 0.192%. Therefore, it is understood that at the point in which the step (D) reaches $0.04\lambda$, the type 2 and the type 3 become larger than the type 1 in the electromechanical coupling coefficient, and the difference therebetween increases as the step is further increased.

In the present investigation, the measurement is performed until the step (D) reaches $0.14\lambda$, and no reduction in the electromechanical coupling coefficient is observed in the type 2 and the type 3. Further, the type 2 and the type 3 have the film thickness (H) of the IDT of $0.01\lambda$ and $0.02\lambda$, respectively, which correspond to the area where no temporal variation in the frequency is observed according to FIG. 3. Therefore, it is understood that the electromechanical coupling coefficient can be improved while preventing the temporal variation in the frequency in the type 2 and the type 3. Therefore, it is understood that it is possible to design the step (D) so as to fulfill the following formula.

$$0.04\lambda \le D \le 0.14\lambda$$

Further, since the result of FIG. 3 can directly be applied to the case of forming the grooves as in the case of the type 2 and the type 3, the temporal variation in the frequency can be prevented and the electromechanical coupling coefficient can be improved by adjusting the depth of the groove even in the case of forming the grooves on the quartz crystal substrate, providing the film thickness (H) of the IDT is set to $0.04\lambda$ or smaller. Incidentally, the amount of the variation in the frequency shown in FIG. 3 is thought to be preferable if it does not exceed around 10 ppm from a practical point of view. Therefore, according to the investigation described above, by designing the film thickness (H) of the IDT so as to fulfill the following formula, it is possible to achieve improvement of the electromechanical coupling coefficient while preventing the temporal variation in the frequency.

$$0.01\lambda \le H \le 0.06\lambda$$

Further, as shown in FIG. 4, in comparison between the type 2 having the film thickness of the IDT of $0.01\lambda$ and the type 3 having the film thickness of the IDT of $0.02\lambda$, it is understood that the type 2 has a higher electromechanical coupling coefficient. Therefore, it is understood that the thinner film thickness of the IDT is formed, the higher the electromechanical coupling coefficient becomes.

Figure 5A:
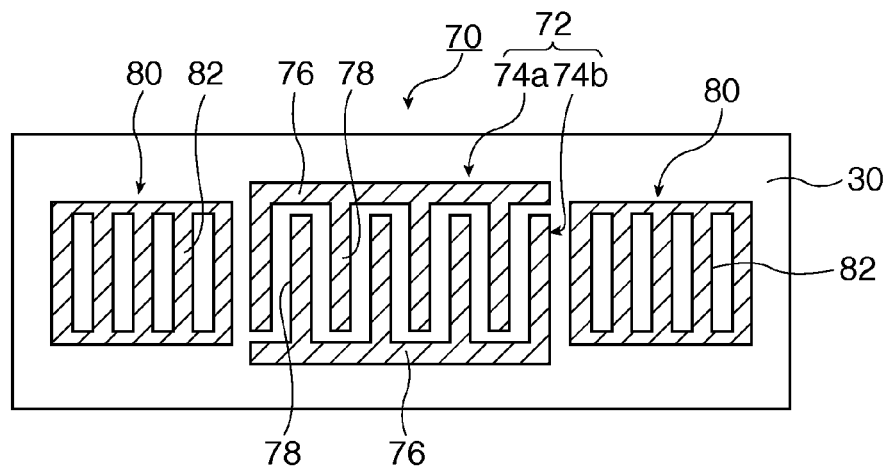
Figure 5B:
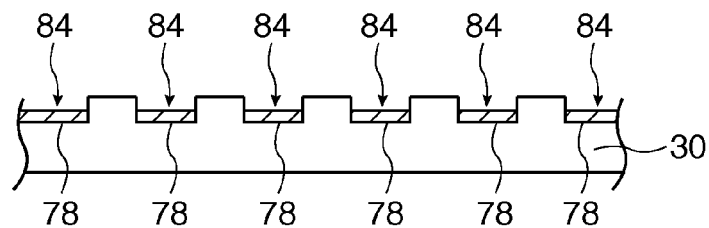
Figure 5C:
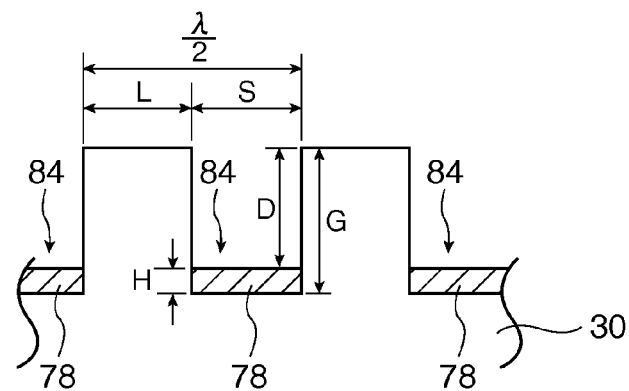

FIGS. 5A through 5C show a surface acoustic wave (SAW) resonator according to a second embodiment. FIG. 5A is a plan view, and FIG. 5B is a partial enlarged cross-sectional view of FIG. 5A. Although in the surface acoustic wave (SAW) resonator 70 according to the second embodiment, the quartz crystal substrate 30 similar to that of the first embodiment is used, an IDT (electrode fingers 78, bus bars 76, comb-shaped electrodes 74a, 74b), and reflectors 80 (conductor strips 82) are formed as a result, the SAW resonator 70 is different therefrom in the point that the electrode fingers are formed on the inner bottom surfaces of the grooves 84 formed as stripes in the direction in which the SH wave propagates. Similarly, the grooves (not shown) are also formed at the positions at which the bus bars 76 and the reflectors 80 (the conductor strips 82) are formed, and the bus bars 76 and the reflectors 80 (the conductor strips 82) are formed inside (on the inner bottom surfaces) of the grooves (not shown). It should be noted that the shapes and the directions of the IDT 72 and the reflectors 80 are the same as those of the IDT 12 and the reflectors 20 of the first embodiment, respectively. Therefore, each of the excitation positions of the surface acoustic wave of the SAW resonator 70 according to the second embodiment is located on the inner bottom surface of the corresponding groove 84. In this case, the difference between the depth (G) of the grooves 84 and the film thickness (H) of the electrode fingers 78 forms the step (D=G−H). Further, assuming that the width of the grooves 84 (the electrode fingers 78) is S, and the distance between the grooves 84 is L, the line occupation ratio η (η=S/(L+S)) is appropriately designed taking the frequency characteristics of the SAW resonator 70 and so on into consideration. It should be noted that the present embodiment can also be applied to the SAW oscillator 100.

On the other hand, the surface acoustic wave propagates on the surface of the quartz crystal substrate, and since there is no difference in the surface shape of the quartz crystal substrate 30 except the IDT and the reflectors between the first embodiment and the second embodiment, but there is a difference therebetween in the position where the IDT 12, 72 are formed, no difference occurs in the propagation path of the surface acoustic wave. Therefore, if the same alternating-current voltage is applied to the IDT 12, 72 according to the first embodiment and the second embodiment, respectively, the characteristics of the surface acoustic waves generated by the respective SAW resonators are roughly the same although the phase difference of λ/4 occurs therebetween. In the investigation described above, the case of the first embodiment, namely the case in which the grooves 32 are formed between the electrode fingers 18, is investigated. However, as described above, the characteristics thereof in the case of the second embodiment, namely the case in which the electrode fingers 78 are formed on the inner bottom surfaces of the grooves 84, are roughly the same as those of the first embodiment. Therefore, the results of the investigation described above can also be applied to the second embodiment without modification. Therefore, also in the second embodiment, by adjusting the dimension (the depth G of the grooves 84, the film thickness H of the electrode fingers 78) of the step, it is possible to prevent the temporal variation in the frequency, and at the same time, to improve the electromechanical coupling coefficient.

Therefore, in either of the embodiments, since the IDT 12, 72 are formed to have a small thickness, it is possible to reduce the heat strain and the temporal change in the frequency with respect to the quartz crystal substrate 30, and at the same time, to reduce the variation in the thickness of the IDT 12, 72, thereby reducing the cost. Further, since the large step can be formed on the quartz crystal substrate irrespective of the thickness of the IDT 12, 72, the electromechanical coupling coefficient can be raised to thereby obtain the SAW resonator 10, 70 with a low loss. Further, the SAW oscillator 100 and the electronic device equipped with the SAW resonator 10, 70 become low-loss and low-cost.

What is claimed is:

1. A surface acoustic wave resonator comprising:
    a quartz crystal substrate having Euler angles of ($\phi=0°$, $110°\leq\theta\leq150°$, $88°\leq\psi\leq92°$); and
    an IDT having a plurality of electrode fingers disposed on the quartz crystal substrate, and using a surface acoustic wave as an excitation wave,
    wherein a plurality of grooves arranged in a propagation direction of the surface acoustic wave to form stripes is disposed on the quartz crystal substrate, and
    the electrode fingers are disposed one of between the grooves and inside the grooves.

2. The surface acoustic wave resonator according to claim 1, wherein
    assuming that a wavelength of the surface acoustic wave is λ, and a step formed by the groove and the electrode finger is D, the step D fulfills the following formula
    $0.04\lambda\leq D\leq0.14\lambda$.

3. The surface acoustic wave resonator according to claim 1, wherein
    assuming that a film thickness of the electrode fingers is H, the film thickness H fulfills the following formula
    $0.01\lambda\leq H\leq0.06\lambda$.

4. A surface acoustic wave oscillator comprising:
    the surface acoustic wave resonator according to claim 1.
5. A surface acoustic wave oscillator comprising:
    the surface acoustic wave resonator according to claim 2.
6. A surface acoustic wave oscillator comprising:
    the surface acoustic wave resonator according to claim 3.
7. An electronic device comprising:
    the surface acoustic wave resonator according to claim 1.
8. An electronic device comprising:
    the surface acoustic wave resonator according to claim 2.
9. An electronic device comprising:
    the surface acoustic wave resonator according to claim 3.

* * * * *